United States Patent [19]

Miyauchi et al.

[11] Patent Number: 4,860,305
[45] Date of Patent: Aug. 22, 1989

[54] EXTERNAL CAVITY TYPE SEMICONDUCTOR LASER APPARATUS

[75] Inventors: Nobuyuki Miyauchi, Tenri; Hidenori Kawanishi, Higashiosaka; Shigeki Maei; Osamu Yamamoto, both of Nara; Hiroshi Hayashi, Soraku, all of Japan

[73] Assignee: Sharp Kabushiki Kaisha, Japan

[21] Appl. No.: 161,061

[22] Filed: Feb. 26, 1988

[30] Foreign Application Priority Data

Feb. 27, 1987 [JP] Japan .................................. 62-46332

[51] Int. Cl.$^4$ ........................ H01S 3/08; H01S 3/081; H01S 3/19
[52] U.S. Cl. ....................................... 372/92; 372/36; 372/49; 372/50; 372/93; 372/98; 372/99; 357/19; 357/80; 357/75; 357/81
[58] Field of Search ...................... 372/43, 50, 36, 92, 372/93, 99, 98, 49; 357/19, 81, 80, 75

[56] References Cited

U.S. PATENT DOCUMENTS 4,352,120  9/1982  Kurihara et al. ..................... 357/81
4,366,492 12/1982  Kitamura ............................. 372/36

FOREIGN PATENT DOCUMENTS 3410729  9/1985  Fed. Rep. of Germany ........ 372/43
0111391  7/1983  Japan .................................... 372/92

OTHER PUBLICATIONS

Ettenberg (1978), App. Phys. Lett., 32(11):724–726, "A New Dielectric Facet Reflector for Semiconductor Lasers".

Primary Examiner—William L. Sikes
Assistant Examiner—Georgia Y. Epps
Attorney, Agent, or Firm—Irell & Manella

[57] ABSTRACT

An external cavity type semiconductor laser apparatus comprising a semiconductor laser device and an external cavity, which are mounted on a single mounting base with a space therebetween, wherein laser light emitted from the light-emitting rear facet of the laser device is reflected by the external cavity and returns to the laser device. The reflectivity of the light-emitting rear facet of the laser device being different from that of the light-emitting front facet of the laser device.

4 Claims, 7 Drawing Sheets

FIG.7a
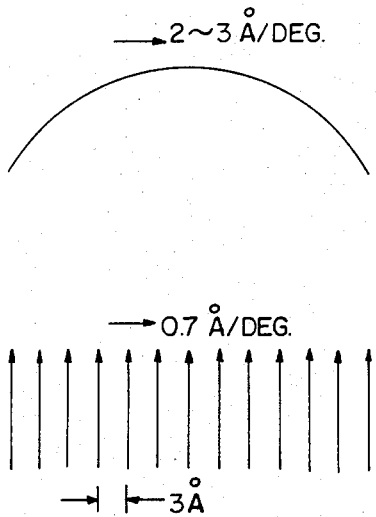
→ 2~3 Å/DEG.
→ 0.7 Å/DEG.
|←3Å
FIG.7b
FIG.8a
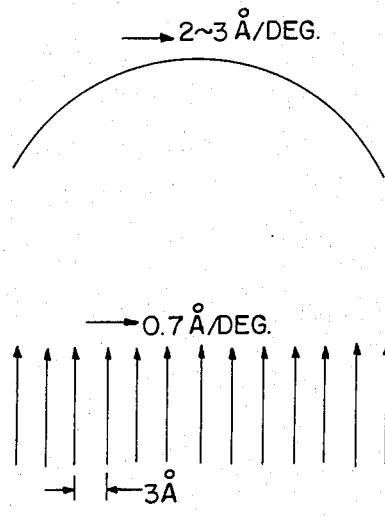
→ 2~3 Å/DEG.
→ 0.7 Å/DEG.
|←3Å
FIG.8b
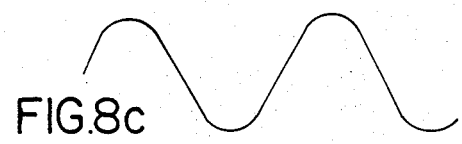
FIG.8c
FIG.7c
FIG.8d

EXTERNAL CAVITY TYPE SEMICONDUCTOR LASER APPARATUS

BACKGROUND OF THE INVENTION

1. Field of the invention

This invention relates to a semiconductor laser apparatus producing a high output power, which can be used as a coherent light source in an optical communication system, an optical measuring system, an optical information processing system, etc.

2. Description of the prior art

In recent years, with the enlarged use of semiconductor lasers in fields such as optical communication, optical measurement, optical information processing, etc., semiconductor lasers producing laser light in a stabilized single longitudinal mode are required as a coherent light source.

For that reason, conventional semiconductor laser devices have been designed so that the oscillation longitudinal mode of the laser devices can be selected depending upon the gain distribution of laser media and the transmission characteristics of the laser resonator. FIGS. 7(a) to 7(c) show the selectivity of the oscillation longitudinal mode of a conventional semiconductor laser device, wherein FIG. 7(a) shows the relationship between the wavelength and the gain distribution of laser media, FIG. 7(b) shows the relationship between the wavelength and the spectrum of each longitudinal mode, and FIG. 7(c) shows the spectrum in the superradiant situation that is obtained by the superposition of the characteristic curves of FIGS. 7(a) and 7(b). In general, of the longitudinal modes of laser light produced by a semiconductor laser device, a longitudinal mode of laser light with a wavelength that is the closest to the peak (the maximum value) of a gain distribution receives the greatest gain and becomes an oscillation longitudinal mode. However, the bandgap of the semiconductor materials of the laser device varies with changes in the circumferential temperature, and accordingly the wavelength peak of the gain distribution is shifted to the long wavelength side at the rate of 2–3 Å/deg. Moreover, not only the refractive index of laser media varies, but the effective optical length of the laser cavity varies with changes in the thermal expansion of the laser device, so that the said longitudinal modes are shifted to the long wavelength side at the rate of about 0.7 Å/deg., while maintaining a distance of about 3 Å therebetween. Thus, when the circumferential temperature rises, since the amount of change in the gain distribution is greater than that of change in the longitudinal modes at the beginning, the oscillation wavelength continuously varies over a period of time. When the temperature further rises, the oscillation wavelength brings about mode hopping, after which the oscillation wavelength causes the above process to repeat itself resulting in continuous changes and further mode hopping, as shown in FIG. 9, thereby attaining a step function type change. Moreover, the wavelength also varies with changes in current for driving the laser device. The above-mentioned phenomena prevent the application of conventional semiconductor laser devices as a light source for either wavelength multiplex optical-communication or a high resolution spectrometer.

In order to solve these problems, an SEC laser apparatus (short external cavity laser diode) has been invented in which laser light from the light-emitting rear facet of a semiconductor laser device is reflected by an external cavity and returns to the said semiconductor laser device. The oscillation longitudinal mode of the said laser device of the SEC laser apparatus is selected depending upon three factors, namely, the gain distribution of the laser, the longitudinal modes, and the selectivity of wavelength of the external cavity, which are shown in FIGS. 8(a), 8(b) and 8(d) in contradistinction to those of FIGS. 7(a) to 7(c). FIG. 8(a) shows the relationship between the wavelength and the gain distribution of laser media, FIG. 8(b) shows the relationship between the wavelength and the spectrum of each longitudinal mode, FIG. 8(c) shows the relationship between the wavelength and the resonance characteristics of the external cavity, and FIG. 8(d) shows the spectrum in the superradiant situation that is obtained by the superposition of the characteristic curves of FIGS. 8(a) to 8(c). The envelope curve of the spectrum in the superradiant situation of FIG. 8(d) is of a ripple, whereas that of the spectrum in the superradiant situation of FIG. 7(c) is of a smooth circular arch. The temperature characteristics of the peak of the envelope curve can be controlled by changes in the external cavity length (i.e., the distance between the semiconductor laser device and the external cavity), thereby attaining the suppression of mode hopping.

The characteristic of an oscillation wavelength with respect to temperatures of an ordinary SEC laser apparatus are shown in FIGS. 10(a) to 10(c), indicating that the same longitudinal mode is maintained in a temperature range of $\Delta t$; that a longitudinal mode successively receives the greatest gain in the same mountain of the envelope curve of the spectrum shown in FIG. 8(d) in a temperature range of $\Delta T$ and becomes an oscillation longitudinal mode; and that when the temperature range exceeds $\Delta T$, the oscillation longitudinal mode is shifted to the adjacent mountain of the envelope curve, resulting in significant and sudden change of the oscillation longitudinal wavelength (i.e., mode hopping).

Moreover, FIG. 10(a) indicates that the temperature coefficient of the wavelength of the peak of the envelope curve shown in FIG. 8(d), $d\bar{\lambda}/dT$, and the temperature coefficient of the longitudinal modes shown in FIG. 8(b), $\alpha$, have the following relationships: $d\bar{\lambda}/dT < \alpha$, the oscillation longitudinal mode is successively shifted to a longitudinal mode that is positioned at the short wavelength side a small mode hopping in a temperature range of $\Delta T$ results. FIG. 10(b) indicates that when $d\bar{\lambda}/dT = \alpha$, the value of $\Delta T$ becomes equal to $\Delta t$, and the mode hopping does not occur in the range of $\Delta T$. FIG. 10(c) indicates that when $d\bar{\lambda}/dT > \alpha$, the oscillation longitudinal mode is successively shifted to a longitudinal mode that is adjacent to the long wavelength side, resulting in a small mode hopping in the range of $\Delta T$.

The above-mentioned SEC laser is composed of a VSIS (V-channelled Substrate Inner Stripe) semiconductor laser device with an active layer of AlGaAs grown on a GaAs substrate, and an external cavity with a high reflectivity coated by a multilayered dielectric film. Both facets of the laser device are coated by dielectric protective films with a thickness of half of the laser oscillation wavelength, thereby attaining a reflectivity of each of the facets, 0.32, with respect to the laser oscillation wavelength. When conventional SEC laser apparatuses are made with the above-mentioned combination of reflectivities, the level of an optical output power at which a stabilized laser operation can be achieved is low, about 10 mW at best. If the SEC laser apparatuses are operated with an optical output power at a higher level than that mentioned above, a kink occurs to the current-light characteristics of the SEC laser apparatuses because of turbulence of a transverse mode, which causes difficulties in maintaining the fundamental transverse mode and which makes the oscillation longitudinal mode unstable due to the occurrence of multi-mode oscillation, mode competitions, etc. The amount of current for driving the laser apparatuses must be increased with an increase in an optical output, which causes the laser apparatuses to be heated. As a result, the laser apparatuses give rise to an aging and/or deterioration of the characteristics, which causes difficulties in an achievement of high reliability.

Nevertheless, in recent years, laser apparatuses that oscillate laser light with a stabilized wavelength at high optical output power are required for use as a signal light source in optical information processing systems so as to heighten the density of signals, to shorten the period of time for treating the signals and to improve the signal to noise ratio.

SUMMARY OF THE INVENTION

The semiconductor laser apparatus of this invention, which overcomes the above-discussed and numerous other disadvantages and deficiencies of the prior art, comprises a semiconductor laser device and an external cavity, which are mounted on a single mounting base with a space therebetween, wherein laser light emitted from the light-emitting rear facet of said laser device is reflected by said external cavity and returns to said laser device. The reflectivity of the light-emitting rear facet of said laser device being different from that of the light-emitting front facet of said laser device.

In a preferred embodiment, the single mounting base is made of materials having a coefficient of linear expansion that is equal to or smaller than that of Cu. The materials of said single mounting base are Cu, Fe, BeO, GaAs, CBN, Si, SiC or diamond.

In a preferred embodiment, the length of said laser device in the resonating direction is equal to or greater than the length of said external cavity in the same direction.

Thus, the invention described herein makes possible the objectives of (1) providing an external cavity type semiconductor laser apparatus that oscillates laser light in a stabilized longitudinal mode with high reliability and without giving rise to aging of its characteristics even at a high output power operation; and (2) providing of an external cavity type semiconductor laser apparatus that oscillates laser light in a stabilized single longitudinal mode without occurrence of mode hopping in a certain range of specified temperatures even at a high output power operation.

DESCRIPTION OF THE DRAWINGS

This invention may be better understood and its numerous objects and advantages will become apparent to those skilled in the art by reference to the accompanying drawings as follows:

FIGS. 7(a) to 7(c) are characteristic curves showing the selectivity of the oscillation longitudinal mode of a conventional semiconductor laser device.

FIGS. 8(a) to 8(d) are characteristic curves showing the selectivity of the oscillation longitudinal mode of a SEC semiconductor laser apparatus of this invention.

DESCRIPTION OF THE PREFERRED EMBODIMENTS

The behavior of longitudinal oscillation modes of an external cavity type semiconductor laser apparatus depends upon the following three factors, one of which is the gain distribution of a laser device used in the said apparatus, another is a longitudinal mode of the laser device, and the other is the selectivity of an oscillation wavelength by an external cavity used in the said apparatus. As mentioned in Description of Prior Art, with regard to changes in longitudinal oscillation modes due to temperatures, when a laser device is designed considering the dependence of these three factors on temperatures, the laser device can be provided with excellent characteristics that bring about no mode hopping over a temperature span of $\Delta T$. The said laser device can maintain excellent temperature characteristics with regard to its longitudinal oscillation mode without a decrease in reliability and without occurrence of aging even at a high output power operation.

EXAMPLE 1

Figure 1:
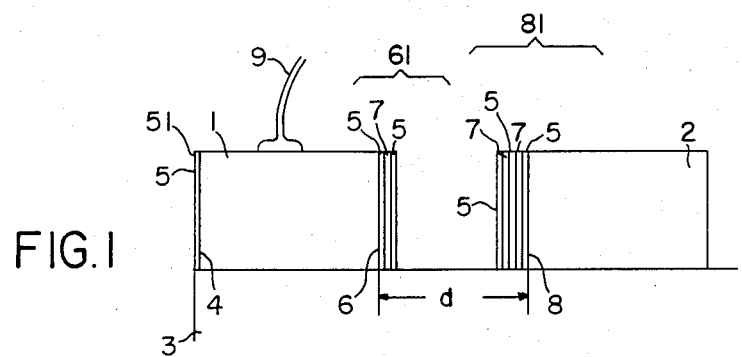
FIG. 1 is a side sectional view showing an external cavity type semiconductor laser apparatus of this invention.

FIG. 1 shows an external cavity type semiconductor laser apparatus of this invention that comprises a VSIS semiconductor laser device 1 and an external cavity 2, which are disposed with a gap (i.e., an external cavity length)d therebetween on a mounting base 3 made of Cu. The VSIS semiconductor laser device 1 has an AlGaAs active layer grown on a GaAs substrate. The front facet 4 of the semiconductor laser device 1 is coated with a single film 51 of an $Al_2O_3$ layer 5, and the rear facet 6 thereof is coated with a triple-layered film 61 composed of an $Al_2O_3$ layer 5, an amorphous Si layer 7 and an $Al_2O_3$ layer 5 in that order, resulting in a reflectivity of 0.05 on the front facet 4 and a reflectivity of 0.7 on the rear facet 6. In this way, the semiconductor laser device 1 is designed so as to differentiate the reflectivity of the front facet 4 from that of the rear facet 6. A lead wire 9 is connected to the semiconductor laser device 1, through which current is injected into the said laser device.

The external cavity 2 is composed of a GaAs chip that has a reflecting plane 8 coated with a multi-layered dielectric films 81. The multi-layered dielectric films 81 are composed of alternate layers consisting of three $Al_2O_3$ layers 5 and two amorphous Si layers 7, resulting in a reflectivity of 0.95 on the reflecting plane 8.

The cavity length of the semiconductor laser device 1 is set to be the same as that of the external cavity 2.

Figure 10A:
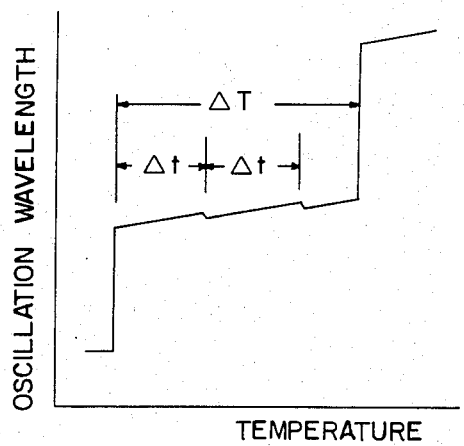
FIGS. 10(a) to 10(c) are characteristic curves showing the relationship between the temperature and the oscillation wavelength of an ordinary SEC semiconductor laser apparatus.
Figure 10B:
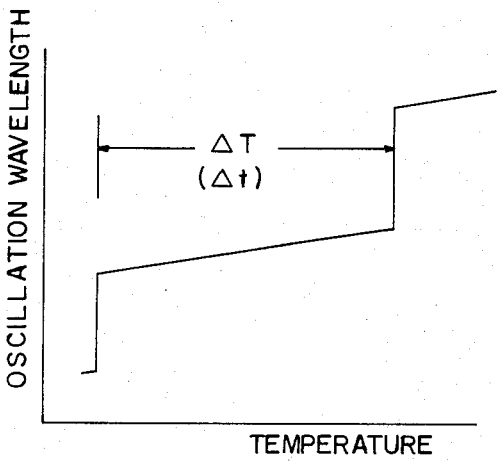
Figure 10C:
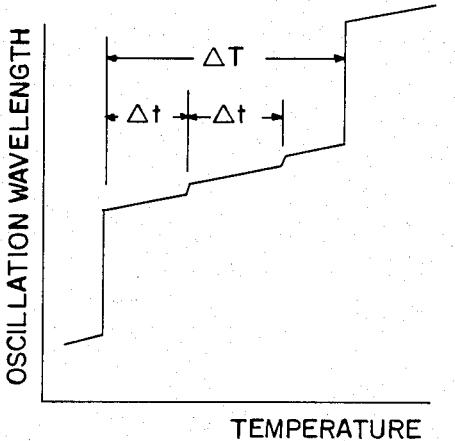

The said external cavity type semiconductor laser apparatus attains stable wavelength and temperature characteristics that give rise to no mode hopping at a high optical output level over 30 mW in a range of temperatures, $\Delta T$, of 13° C., as shown in FIG. 10(b), when the external cavity length d is 120 μm. The rate of changes in a gain distribution due to temperatures, $d\bar{\lambda}g/dT$, of the laser device 1 varies widely from 2.0 Å/°C. to 3.0 Å/°C. (i.e., $2.0 \leq d\bar{\lambda}g/dT \leq 3.0$ Å/°C.). This means that there is an optimum value of d. It has been experimentally found that the optimum value of d is in the range of 100 to 120 μm (i.e., $100 \leq d \leq 120$ μm). At that time, the value of $\Delta T$ is in the range of 10 (exclusive)°C. to 20 (exclusive)°C. (i.e., $10 < \Delta T < 20$°C.

the value of $\Delta T$ that is less than 20° C. is so small that when the changes in an environmental temperature are as small as about 10° C., the laser device gives rise to mode hopping, resulting in a lowering of the function of a system using the said laser device therein. Even though a laser device that does not bring about mode hopping is applied to the system, it is difficult in practice to control the temperatures (at both ends of arrow mark shown in FIG. 10(b)) at which great mode hopping occurs. Accordingly, in the case where a specific temperature range in which mode hopping does not occur must be selected, the yield of laser devices decreases and/or a large amount of time is needed for the selection of characteristics. In order to solve these problems, it is necessary to enlarge a temperature range $\Delta T$ in which mode hopping does not occur and to heighten the probability that a specific temperature range falls within the value of $\Delta T$.

EXAMPLE 2

Figure 2:
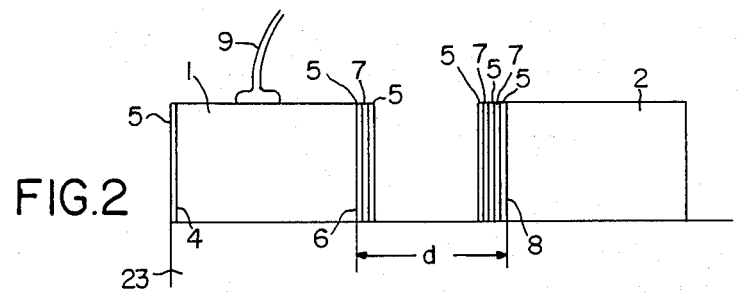
FIG. 2 is a side sectional view showing another external cavity type semiconductor laser apparatus of this invention.

FIG. 2 shows another external cavity type semiconductor laser apparatus of this invention, which has a means by which the value of $\Delta T$ is enlarged. The same reference numberals as those of FIG. 1 indicate the same structure as that of the apparatus of FIG. 1. The length of the laser device 1 in the resonating direction is the same as that of the external cavity 2 in that direction.

In this example, a mounting base 23 on which the laser device 1 and the external cavity 2 are mounted has a coefficient of linear expansion that is smaller than that of Cu. Such a mounting base 23 is made of Fe, BeO, GaAs, CBN, Si, SiC or diamond, the coefficients of linear expansion of which are $11.76 \times 10^{-6}$, $7.6 \times 10^{-6}$, $5.9 \times 10^{-6}$, $4 \times 10^{-6}$, $2.4 \times 10^{-6}$ and $3.7 \times 10^{-6}$ (/°C., respectively, that are smaller than the coefficient of linear expansion of Cu, $17 \times 10^{-6}$ (/°C.).

Figure 5A:
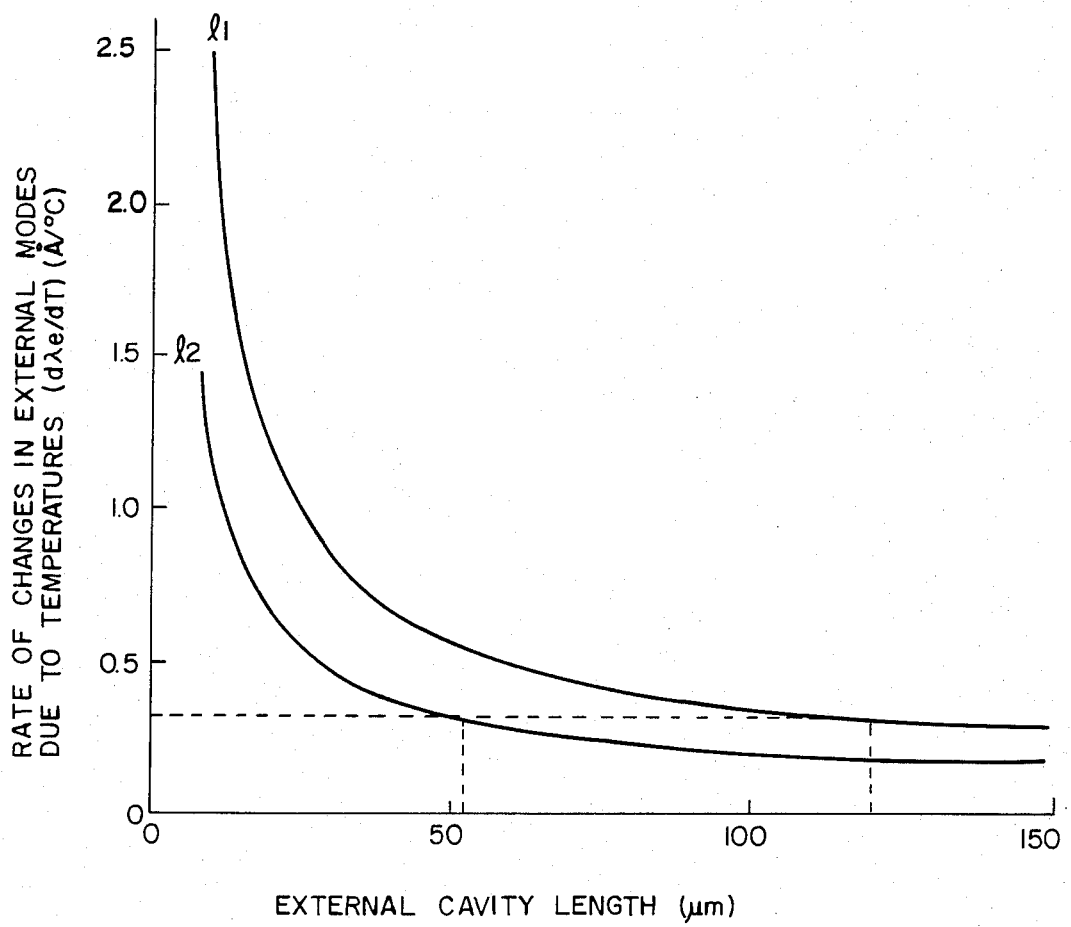
FIGS. 5(a), 5(b), 6(a) and 6(b) are the relationship between the external cavity length and the rate of changes in the external mode due to temperatures with respect to the above-mentioned examples of the semiconductor laser apparatus of this invention.

FIG. 5(a) shows the dependence of the rate of changes in external modes due to temperatures (i.e., the rate of changes in resonance peak wavelengths due to temperatures shown in FIG. 8(c)), $d\lambda e/dT$, on the external cavity length d, wherein curve $1_1$ indicates the case where the mounting base 23 is made of Cu and curve $1_2$ indicates the case where the mounting base 23 is made of Fe. The optimum value of $d\lambda e/dT$ that is experimentally obtained is 0.31 Å/° C., and the external cavity length d is 120 μm for the mounting base of Cu and 51 μm for the mounting base of Fe.

Figure 5B:
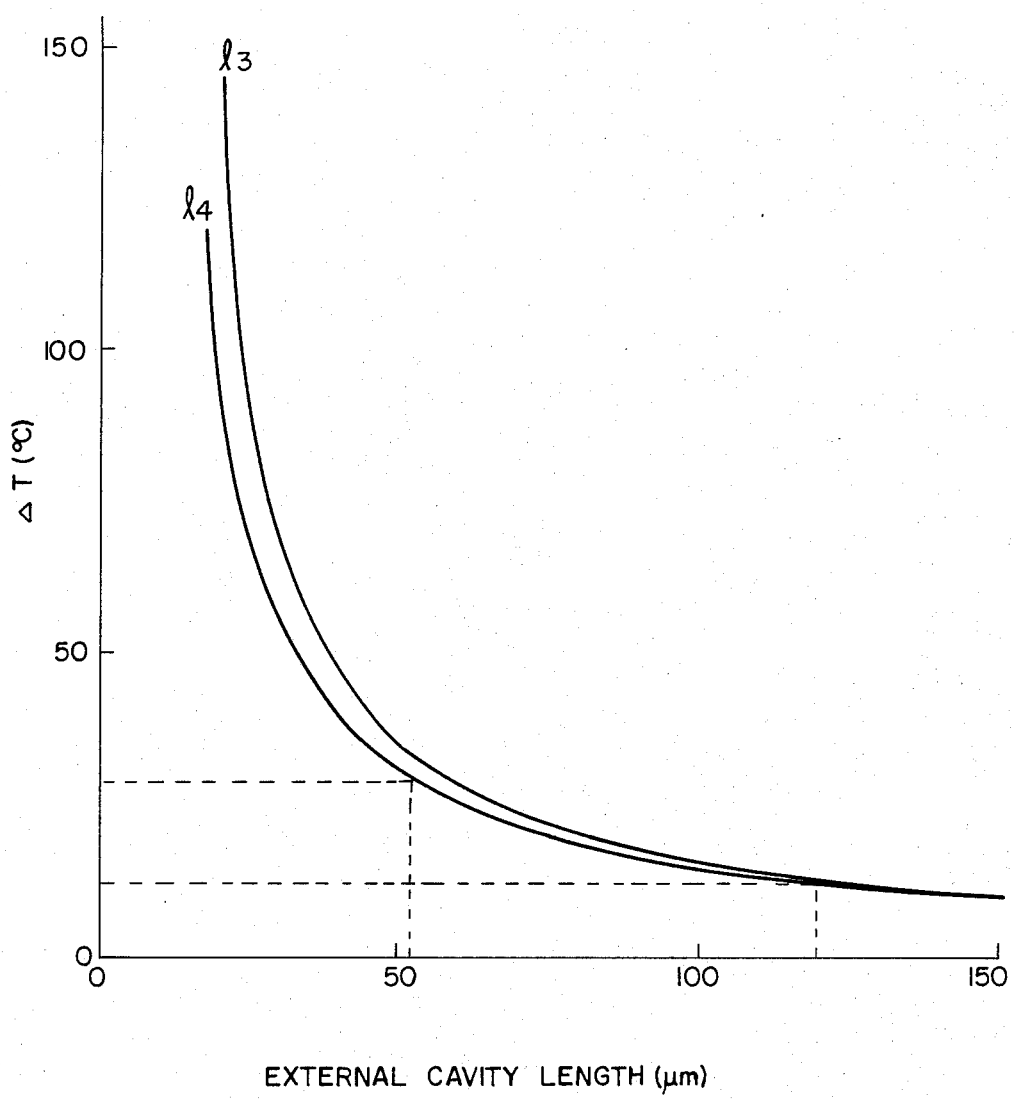

FIG. 5(b) shows the dependence of $\Delta T$ on the external cavity length d, wherein curve $1_3$ indicates the case where the mounting base 23 is made of Cu and curve $1_4$ indicates the case where the mounting base 23 is made of Fe. When the above-mentioned optimum value of $d\lambda e/dT$ is 0.31 Å/°C., the value of $\Delta T$ is 13° C. for the mounting base of Cu with an external cavity length d of 120 μm and is 29° C. for the mounting base of Fe with an external cavity length d of 51 μm. In this way, the value of $\Delta T$ can be enlarged from 13° C. to 29° C. it has been observed that the enlargement of $\Delta T$ can be attained with the above-mentioned materials other than Fe. The data of FIGS. 5(a) and 5(b) uses a laser cavity length of 250 μm and an external reflector length of 250 μm.

In Example 2, the coefficient of linear expansion of materials used for the mounting base is discussed as a means by which the value of $\Delta T$ is enlarged, wherein the length of the laser device 1 is the same as that of the external cavity 2 in the resonating direction.

EXAMPLE 3

It has been found by the inventors of this invention that when the material of the mounting base is fixed and the length of the external cavity 2 is set to be smaller than that of the laser device 1, the value of $\Delta T$ can be also enlarged.

Figure 3:
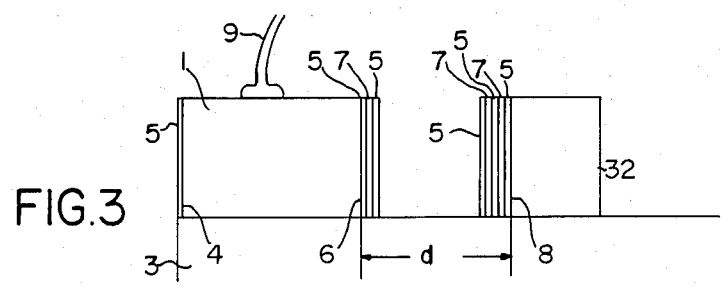
FIG. 3 is a side sectional view showing another external cavity type semiconductor laser apparatus of this invention.

FIG. 3 shows another external cavity type semiconductor laser apparatus of this invention, wherein the same reference numerals as those of FIG. 1 indicate the same structure as that of the apparatus of FIG. 1.

Figure 6A:
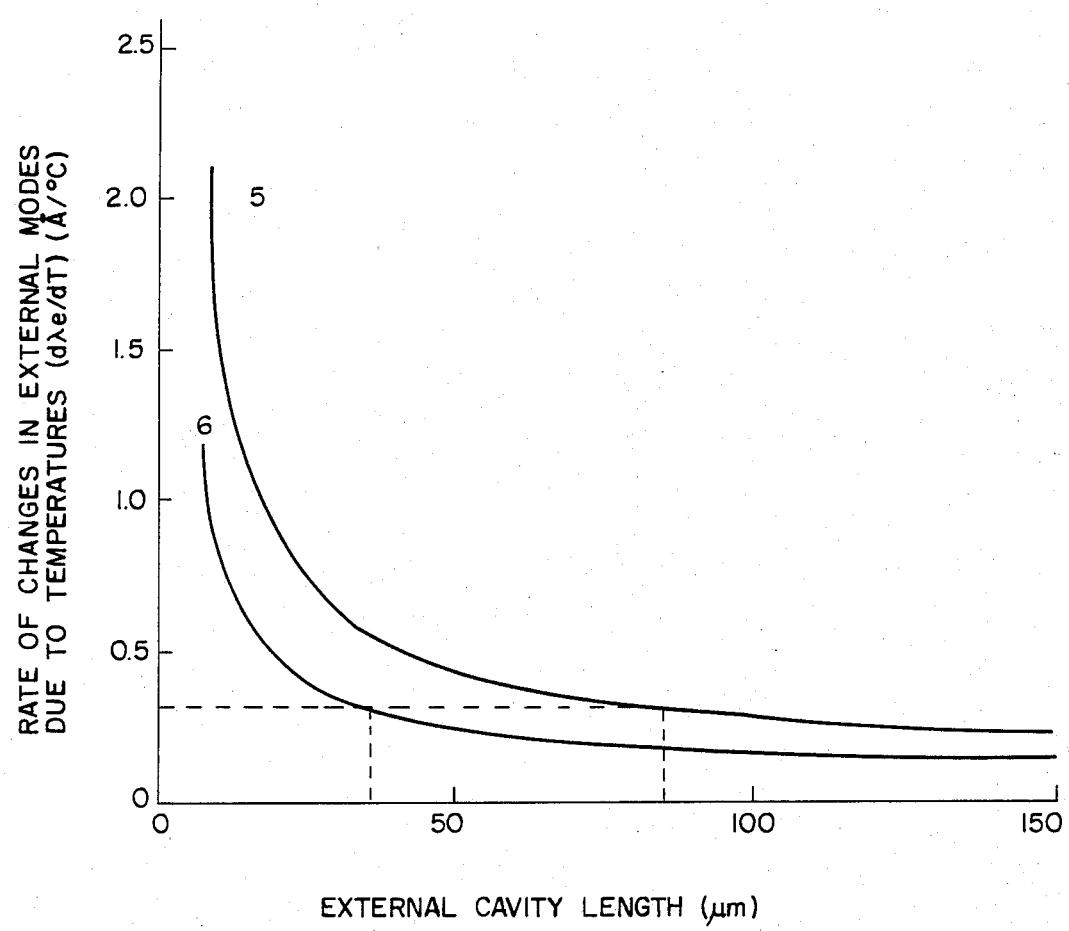
Figure 6B:
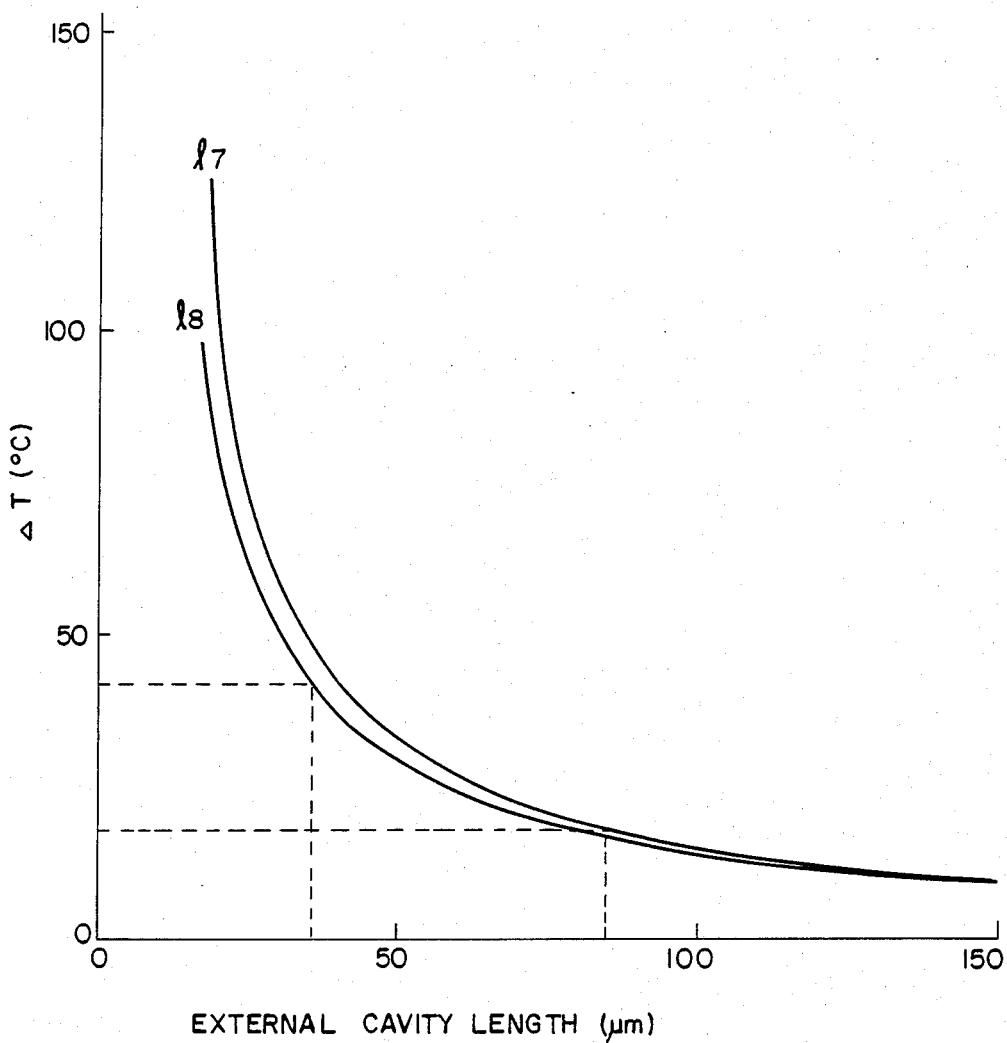
Figure 9:
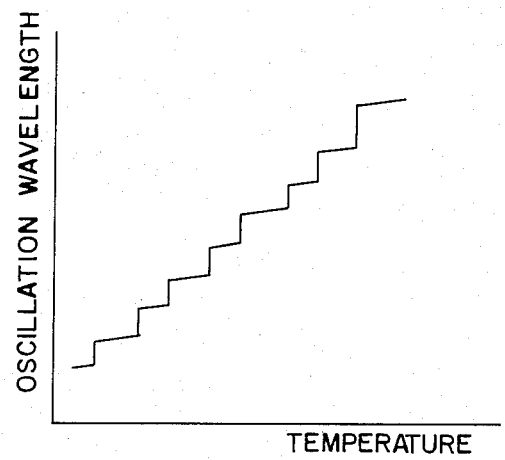
FIG. 9 is a characteristic curve showing the relationship between the temperature and the oscillation wavelength of a conventional semiconductor laser device.

FIG. 6(a) shows the dependence of the rate of changes in external modes due to temperatures, $d\lambda e/dT$, on the external cavity length d in the case where the cavity length of the laser device 1 is set to be 250 μm, the length of the external cavity 32 is set to be 100 μm, and the material of the mounting base 3 is fixed to be Cu. The external cavity length d is $\Xi$μm when the value of $d\lambda e/dT$ at which mode hopping never occurs is 0.31 Å/°C. When the external cavity length d is such a value as 85 μm, the value of $\Delta T$ becomes 18° C. as shown by curve $1_7$ of FIG. 6(b), indicating that the value of $\Delta T$ in this example is enlarged by 5° C., compared with the case where the length of the laser device 1 is the same as that of the external cavity 2.

EXAMPLE 4

Figure 4:
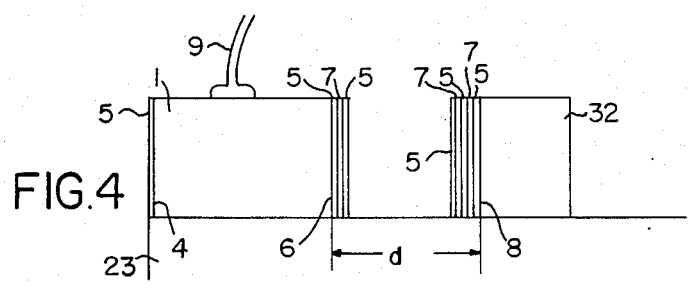
FIG. 4 is a side sectional view showing another external cavity type semiconductor laser apparatus of this invention.

FIG. 4 shows another external cavity type semiconductor laser apparatus of this invention having the same structure as that of Example 3 except that the material of the mounting base 23 of this example is Fe.

The external cavity length d is 36 μm when the value of $d\lambda e/dT$ at which mode hopping does not occur is 0.31 Å/°C. as shown by curve $1_6$ of FIG. 6(a). At this time, the value of $\Delta T$ becomes 42° C. as shown by curve $1_8$ of FIG. 6(b). This means that the value of $\Delta T$ in this example is enlarged by 29° C. compared with that of $\Delta T$ in Example 1 and by 24° C. compared with that of $\Delta T$ in Example 3.

The cavity length of the laser device 1 must be 200 μm or more, otherwise the handling of the laser device 1 becomes delicate and difficult and also the strength of the bonding of a lead wire onto the heat-sink of the laser device cannot be maintained at a fixed level. The length of the external cavity 2 can be set to be 100 μm or less because the external cavity 2 does not necessitate a lead-bonding so that a consideration of the bonding strength against the cavity is unnecessary. The data of FIGS. 6(a) and 6(b) uses a laser cavity length of 250 μm and an external reflector length of 100 μm.

In each of the above-mentioned examples, the reflectivity of the front facet ($R_f$) of the laser device 1 is set to be 0.05, but it is not limited thereto. Even when the value of $R_f$ is set to be 0.2 higher than the value of $R_f$ of the above-mentioned examples, laser oscillation in a stabilized single longitudinal mode can be achieved without occurrence of mode hopping at a high output power. The upper limit of $R_f$ is a parameter that plays an important role when the threshold current level, the external differential efficiency and the operation output are determined. It has been experimentally observed that the value of $R_f$ is preferably 0.32 or less in order for an external cavity type semiconductor laser apparatus to attain laser oscillation in a stabilized single longitudinal mode at a high output power without occurrence of mode hopping in a specific temperature range of ΔT and to attain suppression of a decrease in reliability and on aging of the device characteristics. The value of $R_f$ that is 0.32 corresponds to the reflectivity of a cleaved facet of AlGaAs semiconductor laser devices that is not coated with any coating film. This fact can be applied to semiconductor laser devices formed by other crystal materials, and thus it can be said that the reflectivity of the front facet $R_f$ must be set to be, preferably, a value of less than the reflectivity of a cleaved facet without any coating films.

The reflectivity $R_r$ of the rear facet of the semiconductor laser device 1 is set to be 0.7 in the above-mentioned examples, but it is not limited thereto. The value of $R_r$ is an important parameter in the same way as that of $R_f$. It has been experimentally observed that the value of $R_r$ is preferably in the range of 0.32 (exclusive) to 0.7 (inclusive) (i.e., $0.32 < R_4 \leq 0.7$). When a high output power must be attained by the use of an ordinary laser device, the reflectivity $R_r$ of the rear facet of the said laser device is set to be 0.9 or more. However, with a SEC laser device, when the value of $R_r$ exceeds 0.7, an optical coupling between the longitudinal mode of the laser device and the resonance mode of the external cavity is weakened so that the longitudinal oscillation mode cannot be maintained to be a specific longitudinal mode when temperatures vary, and as a result, mode hopping successively occurs from the initial longitudinal mode to the adjacent longitudinal mode. When the value of $R_r$ is less than 0.32, a decrease in the external differential efficiency can be easily obtained, which causes difficulties in a high output operation. The value of $R_r$ that is 0.32 corresponds to the reflectivity of a cleaved facet itself of AlGaAs semiconductor laser devices that is not coated with any coating film, and thus the reflectivity $R_r$ of the rear facet of the laser device depends upon the material constituting the said laser device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An external cavity type semiconductor laser apparatus comprising a semiconductor laser device and an external cavity, which are mounted on a single mounting base with a space therebetween, wherein laser light emitted from the light-emitting rear facet of said laser device is reflected by said external cavity and returns to said laser device. The reflectivity of the light-emitting rear facet of said laser device being different from that of the light-emitting front facet of said laser device.

2. An external cavity type semiconductor laser apparatus according to claim 1, wherein said single mounting base is made of materials having a coefficient of linear expansion that is equal to or smaller than that of Cu.

3. An external cavity type semiconductor laser apparatus according to claim 2, wherein the materials of said single mounting base are Cu, Fe, BeO, GaAs, CBN, Si, SiC or diamond.

4. An external cavity type semiconductor laser apparatus according to claim 1, wherein the length of said laser device in the resonating direction is equal to or greater than the length of said external cavity in the same direction.

* * * * *